(12) United States Patent
Ogino

(10) Patent No.: US 9,536,966 B2
(45) Date of Patent: Jan. 3, 2017

(54) GATE STRUCTURES FOR III-N DEVICES

(71) Applicant: Transphorm Inc., Goleta, CA (US)

(72) Inventor: Tsutomu Ogino, Aizu-Wakamatsu (JP)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 14/970,375

(22) Filed: Dec. 15, 2015

(65) Prior Publication Data

US 2016/0172480 A1  Jun. 16, 2016

Related U.S. Application Data

(60) Provisional application No. 62/092,732, filed on Dec. 16, 2014.

(51) Int. Cl.
| | |
|---|---|
| *H01L 29/51* | (2006.01) |
| *H01L 29/417* | (2006.01) |
| *H01L 29/66* | (2006.01) |
| *H01L 29/778* | (2006.01) |

(Continued)

(52) U.S. Cl.
CPC ... *H01L 29/41758* (2013.01); *H01L 29/66462* (2013.01); *H01L 29/7786* (2013.01); *H01L 29/2003* (2013.01); *H01L 29/42376* (2013.01); *H01L 29/518* (2013.01)

(58) Field of Classification Search
CPC .......... H01L 29/7787; H01L 29/66462; H01L 29/518
See application file for complete search history.

(56) References Cited

U.S. PATENT DOCUMENTS

| | | |
|---|---|---|
| 4,300,091 A | 11/1981 | Schade, Jr. |
| 4,532,439 A | 7/1985 | Koike |
| 4,645,562 A | 2/1987 | Liao et al. |

(Continued)

FOREIGN PATENT DOCUMENTS

| | | |
|---|---|---|
| CN | 1596477 | 3/2005 |
| CN | 1748320 | 3/2006 |

(Continued)

OTHER PUBLICATIONS

Authorized officer Chung Keun Lee, International Search Report and Written Opinion in PCT/US2008/076030, mailed Mar. 23, 2009, 10 pages.

(Continued)

*Primary Examiner* — Matthew Reames
(74) *Attorney, Agent, or Firm* — Fish & Richardson P.C.

(57) ABSTRACT

A semiconductor device includes a III-N layer, a plurality of parallel conductive fingers on the III-N layer, an insulator layer over the III-N layer, and a gate. The plurality of parallel conductive fingers includes a source and drain bus, a plurality of source fingers coupled to the source bus and extending from the source bus towards the drain bus to respective source finger ends, and a plurality of drain fingers coupled to the drain bus and extending from the drain bus towards the source bus to respective drain finger ends, the drain fingers being interdigitated between the source fingers. The gate comprises a plurality of straight and a plurality of connecting sections, each straight section between a source finger and adjacent drain finger, and the connecting sections each joining two adjacent straight sections and curving around a respective source or drain finger end.

22 Claims, 16 Drawing Sheets

(51) Int. Cl.
  *H01L 29/20* (2006.01)
  *H01L 29/423* (2006.01)

(56) References Cited

U.S. PATENT DOCUMENTS

| | | |
|---|---|---|
| 4,665,508 A | 5/1987 | Chang |
| 4,728,826 A | 3/1988 | Einzinger et al. |
| 4,821,093 A | 4/1989 | Iafrate et al. |
| 4,914,489 A | 4/1990 | Awano |
| 5,051,618 A | 9/1991 | Lou |
| 5,329,147 A | 7/1994 | Vo et al. |
| 5,618,384 A | 4/1997 | Chan et al. |
| 5,646,069 A | 7/1997 | Jelloian et al. |
| 5,663,091 A | 9/1997 | Yen et al. |
| 5,705,847 A | 1/1998 | Kashiwa et al. |
| 5,714,393 A | 2/1998 | Wild et al. |
| 5,909,103 A | 6/1999 | Williams |
| 5,998,810 A | 12/1999 | Hatano et al. |
| 6,008,684 A | 12/1999 | Ker et al. |
| 6,097,046 A | 8/2000 | Plumton |
| 6,100,571 A | 8/2000 | Mizuta et al. |
| 6,292,500 B1 | 9/2001 | Kouchi et al. |
| 6,307,220 B1 | 10/2001 | Yamazaki |
| 6,316,793 B1 | 11/2001 | Sheppard et al. |
| 6,373,082 B1 | 4/2002 | Ohno et al. |
| 6,429,468 B1 | 8/2002 | Hsu et al. |
| 6,475,889 B1 | 11/2002 | Ring |
| 6,486,502 B1 | 11/2002 | Sheppard et al. |
| 6,504,235 B2 | 1/2003 | Schmitz et al. |
| 6,515,303 B2 | 2/2003 | Ring |
| 6,548,333 B2 | 4/2003 | Smith |
| 6,552,373 B2 | 4/2003 | Ando et al. |
| 6,580,101 B2 | 6/2003 | Yoshida |
| 6,583,454 B2 | 6/2003 | Sheppard et al. |
| 6,586,781 B2 | 7/2003 | Wu et al. |
| 6,624,452 B2 | 9/2003 | Yu et al. |
| 6,633,195 B2 | 10/2003 | Baudelot et al. |
| 6,649,497 B2 | 11/2003 | Ring |
| 6,727,531 B1 | 4/2004 | Redwing et al. |
| 6,746,938 B2 | 6/2004 | Uchiyama et al. |
| 6,777,278 B2 | 8/2004 | Smith |
| 6,849,882 B2 | 2/2005 | Chavarkar et al. |
| 6,867,078 B1 | 3/2005 | Green et al. |
| 6,914,273 B2 | 7/2005 | Ren et al. |
| 6,946,739 B2 | 9/2005 | Ring |
| 6,979,863 B2 | 12/2005 | Ryu |
| 6,982,204 B2 | 1/2006 | Saxler et al. |
| 7,030,428 B2 | 4/2006 | Saxler |
| 7,038,252 B2 | 5/2006 | Saito et al. |
| 7,045,404 B2 | 5/2006 | Sheppard et al. |
| 7,053,413 B2 | 5/2006 | D'Evelyn et al. |
| 7,071,498 B2 | 7/2006 | Johnson et al. |
| 7,078,743 B2 | 7/2006 | Murata et al. |
| 7,084,475 B2 | 8/2006 | Shelton et al. |
| 7,109,552 B2 | 9/2006 | Wu |
| 7,125,786 B2 | 10/2006 | Ring et al. |
| 7,126,212 B2 | 10/2006 | Enquist et al. |
| 7,161,194 B2 | 1/2007 | Parikh et al. |
| 7,169,634 B2 | 1/2007 | Zhao et al. |
| 7,170,111 B2 | 1/2007 | Saxler |
| 7,199,640 B2 | 4/2007 | De Cremoux et al. |
| 7,217,960 B2 | 5/2007 | Ueno et al. |
| 7,230,284 B2 | 6/2007 | Parikh et al. |
| 7,238,560 B2 | 7/2007 | Sheppard et al. |
| 7,250,641 B2 | 7/2007 | Saito et al. |
| 7,253,454 B2 | 8/2007 | Saxler |
| 7,265,399 B2 | 9/2007 | Sriram et al. |
| 7,268,375 B2 | 9/2007 | Shur et al. |
| 7,304,331 B2 | 12/2007 | Saito et al. |
| 7,321,132 B2 | 1/2008 | Robinson et al. |
| 7,326,971 B2 | 2/2008 | Harris et al. |
| 7,332,795 B2 | 2/2008 | Smith et al. |
| 7,364,988 B2 | 4/2008 | Harris et al. |
| 7,375,407 B2 | 5/2008 | Yanagihara et al. |
| 7,382,001 B2 | 6/2008 | Beach |
| 7,388,236 B2 | 6/2008 | Wu et al. |
| 7,419,892 B2 | 9/2008 | Sheppard et al. |
| 7,429,534 B2 | 9/2008 | Gaska et al. |
| 7,432,142 B2 | 10/2008 | Saxler et al. |
| 7,436,001 B2 | 10/2008 | Lee et al. |
| 7,449,730 B2 | 11/2008 | Kuraguchi |
| 7,456,443 B2 | 11/2008 | Saxler et al. |
| 7,465,967 B2 | 12/2008 | Smith et al. |
| 7,465,997 B2 | 12/2008 | Kinzer et al. |
| 7,482,788 B2 | 1/2009 | Yang |
| 7,488,992 B2 | 2/2009 | Robinson |
| 7,501,669 B2 | 3/2009 | Parikh et al. |
| 7,501,670 B2 | 3/2009 | Murphy |
| 7,508,014 B2 | 3/2009 | Tanimoto |
| 7,544,963 B2 | 6/2009 | Saxler |
| 7,547,925 B2 | 6/2009 | Wong et al. |
| 7,548,112 B2 | 6/2009 | Sheppard |
| 7,550,781 B2 | 6/2009 | Kinzer et al. |
| 7,550,783 B2 | 6/2009 | Wu et al. |
| 7,550,784 B2 | 6/2009 | Saxler et al. |
| 7,566,580 B2 | 7/2009 | Keller et al. |
| 7,566,918 B2 | 7/2009 | Wu et al. |
| 7,573,078 B2 | 8/2009 | Wu et al. |
| 7,592,211 B2 | 9/2009 | Sheppard et al. |
| 7,598,108 B2 | 10/2009 | Li et al. |
| 7,601,993 B2 | 10/2009 | Hoshi et al. |
| 7,605,017 B2 | 10/2009 | Hayashi et al. |
| 7,612,363 B2 | 11/2009 | Takeda et al. |
| 7,612,390 B2 | 11/2009 | Saxler et al. |
| 7,615,774 B2 | 11/2009 | Saxler |
| 7,629,627 B2 | 12/2009 | Mil'shtein et al. |
| 7,638,818 B2 | 12/2009 | Wu et al. |
| 7,655,962 B2 | 2/2010 | Simin et al. |
| 7,678,628 B2 | 3/2010 | Sheppard et al. |
| 7,692,263 B2 | 4/2010 | Wu et al. |
| 7,700,973 B2 | 4/2010 | Shen et al. |
| 7,709,269 B2 | 5/2010 | Smith et al. |
| 7,709,859 B2 | 5/2010 | Smith et al. |
| 7,714,360 B2 | 5/2010 | Otsuka et al. |
| 7,723,739 B2 | 5/2010 | Takano et al. |
| 7,728,356 B2 | 6/2010 | Suh et al. |
| 7,745,851 B2 | 6/2010 | Harris |
| 7,755,108 B2 | 7/2010 | Kuraguchi |
| 7,759,699 B2 | 7/2010 | Beach |
| 7,759,700 B2 | 7/2010 | Ueno et al. |
| 7,777,252 B2 | 8/2010 | Sugimoto et al. |
| 7,777,254 B2 | 8/2010 | Sato |
| 7,795,622 B2 | 9/2010 | Kikkawa et al. |
| 7,795,642 B2 | 9/2010 | Suh et al. |
| 7,811,872 B2 | 10/2010 | Hoshi et al. |
| 7,812,369 B2 | 10/2010 | Chini et al. |
| 7,834,380 B2 | 11/2010 | Ueda et al. |
| 7,851,825 B2 | 12/2010 | Suh et al. |
| 7,855,401 B2 | 12/2010 | Sheppard et al. |
| 7,859,014 B2 | 12/2010 | Nakayama et al. |
| 7,859,020 B2 | 12/2010 | Kikkawa et al. |
| 7,859,021 B2 | 12/2010 | Kaneko |
| 7,875,537 B2 | 1/2011 | Suvorov et al. |
| 7,875,907 B2 | 1/2011 | Honea et al. |
| 7,875,910 B2 | 1/2011 | Sheppard et al. |
| 7,875,914 B2 | 1/2011 | Sheppard |
| 7,884,394 B2 | 2/2011 | Wu et al. |
| 7,884,395 B2 | 2/2011 | Saito |
| 7,892,974 B2 | 2/2011 | Ring et al. |
| 7,893,424 B2 | 2/2011 | Eichler et al. |
| 7,893,500 B2 | 2/2011 | Wu et al. |
| 7,898,004 B2 | 3/2011 | Wu et al. |
| 7,901,994 B2 | 3/2011 | Saxler et al. |
| 7,906,799 B2 | 3/2011 | Sheppard et al. |
| 7,915,643 B2 | 3/2011 | Suh et al. |
| 7,915,644 B2 | 3/2011 | Wu et al. |
| 7,919,791 B2 | 4/2011 | Flynn et al. |
| 7,928,475 B2 | 4/2011 | Parikh et al. |
| 7,932,539 B2 | 4/2011 | Chen et al. |
| 7,935,985 B2 | 5/2011 | Mishra et al. |
| 7,939,391 B2 | 5/2011 | Suh et al. |
| 7,948,011 B2 | 5/2011 | Rajan et al. |
| 7,955,918 B2 | 6/2011 | Wu et al. |
| 7,955,984 B2 | 6/2011 | Ohki |

(56) References Cited

U.S. PATENT DOCUMENTS

| | | | |
|---|---|---|---|
| 7,956,383 B2 | 6/2011 | Kuroda et al. |
| 7,960,756 B2 | 6/2011 | Sheppard et al. |
| 7,961,482 B2 | 6/2011 | Ribarich |
| 7,965,126 B2 | 6/2011 | Honea et al. |
| 7,973,335 B2 | 7/2011 | Okamoto et al. |
| 7,982,242 B2 | 7/2011 | Goto |
| 7,985,986 B2 | 7/2011 | Heikman et al. |
| 7,985,987 B2 | 7/2011 | Kaneko |
| 8,039,352 B2 | 10/2011 | Mishra et al. |
| 8,044,380 B2 | 10/2011 | Lee |
| 8,049,252 B2 | 11/2011 | Smith et al. |
| 8,076,698 B2 | 12/2011 | Ueda et al. |
| 8,076,699 B2 | 12/2011 | Chen et al. |
| 8,093,606 B2 | 1/2012 | Sonobe et al. |
| 8,110,425 B2 | 2/2012 | Yun |
| 8,114,717 B2 | 2/2012 | Palacios et al. |
| 8,153,515 B2 | 4/2012 | Saxler |
| 8,174,048 B2 | 5/2012 | Beach |
| 8,178,900 B2 | 5/2012 | Kurachi et al. |
| 8,223,458 B2 | 7/2012 | Mochizuki et al. |
| 8,237,196 B2 | 8/2012 | Saito |
| 8,237,198 B2 | 8/2012 | Wu et al. |
| 8,264,003 B2 | 9/2012 | Herman |
| 8,361,816 B2 | 1/2013 | Lee et al. |
| 8,363,437 B2 | 1/2013 | Wang et al. |
| 8,389,975 B2 | 3/2013 | Kikuchi et al. |
| 8,389,977 B2 | 3/2013 | Chu et al. |
| 8,390,000 B2 | 3/2013 | Chu et al. |
| 8,404,042 B2 | 3/2013 | Mizuhara et al. |
| 8,431,960 B2 | 4/2013 | Beach et al. |
| 8,455,885 B2 | 6/2013 | Keller et al. |
| 8,471,267 B2 | 6/2013 | Hayashi et al. |
| 8,476,125 B2 | 7/2013 | Khan et al. |
| 8,492,779 B2 | 7/2013 | Lee |
| 8,502,323 B2 | 8/2013 | Chen |
| 8,519,438 B2 | 8/2013 | Mishra et al. |
| 8,525,231 B2 | 9/2013 | Park et al. |
| 8,530,904 B2 | 9/2013 | Treu et al. |
| 8,598,937 B2 | 12/2013 | Lal et al. |
| 8,603,880 B2 | 12/2013 | Yamada |
| 8,614,460 B2 | 12/2013 | Matsushita |
| 8,652,948 B2 | 2/2014 | Horie et al. |
| 8,674,407 B2 | 3/2014 | Ando et al. |
| 8,698,198 B2 | 4/2014 | Kuraguchi |
| 8,716,141 B2 | 5/2014 | Dora et al. |
| 8,742,460 B2 | 6/2014 | Mishra et al. |
| 8,772,832 B2 | 7/2014 | Boutros |
| 8,785,305 B2 | 7/2014 | Ramdani |
| 8,803,246 B2 | 8/2014 | Wu et al. |
| 2003/0006437 A1 | 1/2003 | Mizuta et al. |
| 2003/0030056 A1 | 2/2003 | Callaway, Jr. |
| 2003/0194656 A1* | 10/2003 | Kudo ............... G03F 7/425 430/314 |
| 2004/0119067 A1 | 6/2004 | Weeks, Jr. et al. |
| 2005/0133816 A1 | 6/2005 | Fan et al. |
| 2005/0189559 A1 | 9/2005 | Saito et al. |
| 2006/0076677 A1 | 4/2006 | Daubenspeck et al. |
| 2006/0145189 A1 | 7/2006 | Beach |
| 2006/0189109 A1 | 8/2006 | Fitzgerald |
| 2006/0202272 A1 | 9/2006 | Wu et al. |
| 2006/0226442 A1 | 10/2006 | Zhang et al. |
| 2007/0018199 A1 | 1/2007 | Sheppard et al. |
| 2007/0045670 A1 | 3/2007 | Kuraguchi |
| 2007/0128743 A1 | 6/2007 | Huang et al. |
| 2007/0131968 A1 | 6/2007 | Morita et al. |
| 2007/0145417 A1 | 6/2007 | Brar et al. |
| 2007/0205433 A1 | 9/2007 | Parikh et al. |
| 2007/0210329 A1 | 9/2007 | Goto |
| 2007/0228477 A1 | 10/2007 | Suzuki et al. |
| 2007/0249119 A1 | 10/2007 | Saito |
| 2007/0295985 A1 | 12/2007 | Weeks, Jr. et al. |
| 2008/0073670 A1 | 3/2008 | Yang et al. |
| 2008/0272397 A1 | 11/2008 | Koudymov et al. |
| 2008/0308813 A1 | 12/2008 | Suh et al. |
| 2009/0045438 A1 | 2/2009 | Inoue et al. |
| 2009/0050936 A1 | 2/2009 | Oka |
| 2009/0072269 A1 | 3/2009 | Suh et al. |
| 2009/0075455 A1 | 3/2009 | Mishra |
| 2009/0085065 A1 | 4/2009 | Mishra et al. |
| 2009/0140262 A1 | 6/2009 | Ohki et al. |
| 2010/0044752 A1* | 2/2010 | Marui ............... H01L 29/7787 257/192 |
| 2010/0065923 A1 | 3/2010 | Charles et al. |
| 2010/0133506 A1 | 6/2010 | Nakanishi et al. |
| 2010/0203234 A1 | 8/2010 | Anderson et al. |
| 2010/0219445 A1 | 9/2010 | Yokoyama et al. |
| 2011/0012110 A1 | 1/2011 | Sazawa et al. |
| 2011/0049526 A1* | 3/2011 | Chu ............... H01L 21/28587 257/76 |
| 2012/0217512 A1 | 8/2012 | Renaud |
| 2012/0267637 A1 | 10/2012 | Jeon et al. |
| 2013/0056744 A1 | 3/2013 | Mishra et al. |
| 2013/0328061 A1 | 12/2013 | Chu et al. |
| 2014/0084346 A1 | 3/2014 | Tajiri |
| 2014/0099757 A1 | 4/2014 | Parikh et al. |
| 2014/0231875 A1* | 8/2014 | Takatani ............... H01L 27/0266 257/195 |
| 2014/0264370 A1 | 9/2014 | Keller et al. |
| 2014/0264455 A1 | 9/2014 | Keller et al. |

FOREIGN PATENT DOCUMENTS

| | | |
|---|---|---|
| CN | 101107713 | 1/2008 |
| CN | 101312207 | 11/2008 |
| CN | 101897029 | 11/2010 |
| CN | 102017160 | 4/2011 |
| CN | 103477543 | 12/2013 |
| CN | 103493206 | 1/2014 |
| EP | 1 998 376 | 12/2008 |
| EP | 2 188 842 | 5/2010 |
| JP | 09-306926 | 11/1997 |
| JP | 11-224950 | 8/1999 |
| JP | 2000-058871 | 2/2000 |
| JP | 2003-229566 | 8/2003 |
| JP | 2003-244943 | 8/2003 |
| JP | 2004-253620 | 9/2004 |
| JP | 2004-260114 | 9/2004 |
| JP | 2006-032749 | 2/2006 |
| JP | 2006-033723 | 2/2006 |
| JP | 2007-036218 | 2/2007 |
| JP | 2007-505501 | 3/2007 |
| JP | 2007-215331 | 8/2007 |
| JP | 2008-091699 | 4/2008 |
| JP | 2008-199771 | 8/2008 |
| JP | 2008-243848 | 10/2008 |
| JP | 2009-503815 | 1/2009 |
| JP | 2009-524242 | 6/2009 |
| JP | 2010-087076 | 4/2010 |
| JP | 2010-525023 | 7/2010 |
| JP | 2010-539712 | 12/2010 |
| KR | 2011-0033584 | 3/2011 |
| TW | 200924068 | 6/2009 |
| TW | 200924201 | 6/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201322443 | 6/2013 |
| WO | WO 2004/070791 | 8/2004 |
| WO | WO 2004/098060 | 11/2004 |
| WO | WO 2005/036749 | 4/2005 |
| WO | WO 2005/070007 | 8/2005 |
| WO | WO 2005/070009 | 8/2005 |
| WO | WO 2006/114883 | 11/2006 |
| WO | WO 2007/077666 | 7/2007 |
| WO | WO 2007/108404 | 9/2007 |
| WO | WO 2008/120094 | 10/2008 |
| WO | WO 2009/036181 | 3/2009 |
| WO | WO 2009/036266 | 3/2009 |
| WO | WO 2009/039028 | 3/2009 |
| WO | WO 2009/039041 | 3/2009 |
| WO | WO 2009/076076 | 6/2009 |
| WO | WO 2009/132039 | 10/2009 |

(56) References Cited

FOREIGN PATENT DOCUMENTS

| WO | WO 2010/039463 | 4/2010 |
|---|---|---|
| WO | WO 2010/068554 | 6/2010 |
| WO | WO 2010/090885 | 8/2010 |
| WO | WO 2010/132587 | 11/2010 |
| WO | WO 2011/031431 | 3/2011 |
| WO | WO 2011/072027 | 6/2011 |
| WO | WO 2013/052833 | 4/2013 |

OTHER PUBLICATIONS

Authorized officer Yolaine Cussac, International Preliminary Report on Patentability in PCT/US2008/076030, Mar. 25, 2010, 5 pages.
Authorized officer Chung Keun Lee, International Search Report and Written Opinion in PCT/US2008/076079, mailed Mar. 20, 2009, 11 pages.
Authorized officer Nora Lindner, International Preliminary Report on Patentability in PCT/US2008/076079, mailed Apr. 1, 2010, 6 pages.
Authorized officer Kean Hyeong Kim, International Search Report and Written Opinion in PCT/US2008/076160 mailed Mar. 18, 2009, 11 pages.
Authorized officer Simin Baharlou, International Preliminary Report on Patentability in PCT/US2008/076160, mailed Mar. 25, 2010, 6 pages.
Authorized officer Chung Keun Lee, International Search Report and Written Opinion in PCT/US2008/076199, mailed Mar. 24, 2009, 11 pages.
Authorized officer Dorothée Mülhausen, International Preliminary Report on Patentability in PCT/US2008/076199, mailed Apr. 1, 2010, 6 pages.
Authorized officer Keon Hyeong Kim, International Search Report and Written Opinion in PCT/US2008/085031, mailed Jun. 24, 2009, 11 pages.
Authorized officer Yolaine Cussac, International Preliminary Report on Patentability in PCT/US2008/085031, mailed Jun. 24, 2010, 6 pages.
Authorized officer Tae Hoon Kim, International Search Report and Written Opinion in PCT/US2009/041304, mailed Dec. 18, 2009, 13 pages.
Authorized officer Dorothée Mülhausen, International Preliminary Report on Patentability, in PCT/US2009/041304, mailed Nov. 4, 2010, 8 pages.
Authorized officer Sung Hee Kim, International Search Report and the Written Opinion in PCT/US2009/057554, mailed May 10, 2010, 13 pages.
Authorized Officer Gijsbertus Beijer, International Preliminary Report on Patentability in PCT/US2009/057554, mailed Mar. 29, 2011, 7 pages.
Authorized officer Cheon Whan Cho, International Search Report and Written Opinion in PCT/US2009/066647, mailed Jul. 1, 2010, 16 pages.
Authorized officer Athina Nikitas-Etienne, International Preliminary Report on Patentability in PCT/US2009/066647, mailed Jun. 23, 2011, 12 pages.
Authorized officer Sung Chan Chung, International Search Report and Written Opinion for PCT/US2010/021824, mailed Aug. 23, 2010, 9 pages.
Authorized officer Beate Giffo-Schmitt, International Preliminary Report on Patentability in PCT/US2010/021824, mailed Aug. 18, 2011, 6 pages.
Authorized officer Sang Ho Lee, International Search Report and Written Opinion in PCT/US2010/034579, mailed Dec. 24, 2010, 9 pages.
Authorized officer Nora Lindner, International Preliminary Report on Patentability in PCT/US2010/034579, mailed Nov. 24, 2011, 7 pages.
Authorized officer Jeongmin Choi, International Search Report and Written Opinion in PCT/US2010/046193, mailed Apr. 26, 2011, 13 pages.

Authorized officer Philippe Bécamel, International Preliminary Report on Patentability in PCT/US2010/046193, mailed Mar. 8, 2012, 10 pages.
Authorized officer Sang Ho Lee, International Search Report and Written Opinion in PCT/US2010/059486, mailed Jul. 26, 2011, 9 pages.
Authorized officer Nora Lindner, International Preliminary Report on Patentability in PCT/US2010/059486, mailed Jun. 21, 2012, 6 pages.
Authorized officer Kwan Sik Sul, International Search Report and Written Opinion in PCT/US2011/063975, mailed May 18, 2012, 8 pages.
Authorized officer Simin Baharlou, International Preliminary Report on Patentability in PCT/US2011/063975, mailed Jun. 27, 2013, 5 pages.
Authorized officer Sang-Taek Kim, International Search Report and Written Opinion in PCT/US2011/061407, mailed May 22, 2012, 10 pages.
Authorized officer Lingfei Bai, International Preliminary Report on Patentability in PCT/US2011/061407, mailed Jun. 6, 2013, 7 pages.
Authorized officer Kwan Sik Sul, International Search Report and Written Opinion in PCT/US2012/023160, mailed May 24, 2012, 9 pages.
Authorized officer Simin Baharlou, International Preliminary Report on Patentability in PCT/US2012/023160, mailed Aug. 15, 2013, 6 pages.
Authorized officer Jeongmin Choi, International Search Report and Written Opinion in PCT/US2012/027146, mailed Sep. 24, 2012, 12 pages.
Authorized officer Athina Nickitas-Etienne, International Preliminary Report on Patentability in PCT/US2012/027146, mailed Sep. 19, 2013, 9 pages.
Authorized officer Tae Hoon Kim, International Search Report and Written Opinion in PCT/US2013/035837, mailed Jul. 30, 2013, 9 pages.
Authorized officer Agnes Wittmann-Regis, International Preliminary Report on Patentability in PCT/US2013/035837, mailed Oct. 23, 2014, 6 pages.
Authorized officer Sang Won Choi, International Search Report and Written Opinion in PCT/US2013/048275, mailed Oct. 14, 2013, 17 pages.
Authorized officer Simin Baharlou, International Preliminary Report on Patentability in PCT/US2013/048275, mailed Jan. 8, 2015, 14 pages.
Authorized officer Hye Lyun Park, International Search Report and Written Opinion in PCT/US2013/050914, mailed Oct. 18, 2013, 11 pages.
Authorized officer Yukari Nakamura, International Preliminary Report on Patentability in PCT/US2013/050914, mailed Jan. 29, 2015, 8 pages.
Authorized officer Sang Won Choi, International Search Report and Written Opinion in PCT/US2013/024470, mailed May 27, 2013, 12 pages.
Authorized officer Simin Baharlou, International Preliminary Report on Patentability in PCT/US2013/024470, mailed Aug. 14, 2014, 9 pages.
Authorized officer June Young Son, International Search Report and Written Opinion in PCT/US2014/016298, mailed May 23, 2014, 15 pages.
Authorized officer Kihwan Moon, International Preliminary Report on Patentability in PCT/US2014/016298, mailed Aug. 27, 2015, 12 pages.
Authorized officer Tae Hoon Kim, International Search Report and Written Opinion in PCT/US2014/027523, mailed Jul. 30, 2014, 14 pages.
Authorized officer Nora Lindner, International Preliminary Report on Patentability in PCT/US2014/027523, mailed Sep. 24, 2015, 11 pages.
Authorized officer June Young Son, International Search Report and Written Opinion in PCT/US2014/024191, mailed Aug. 7, 2014, 11 pages.

(56) References Cited

OTHER PUBLICATIONS

Authorized officer Kihwan Moon, International Preliminary Report on Patentability in PCT/US2014/024191, mailed Sep. 24, 2015, 8 pages.

Authorized officer June Young Son, International Search Report and Written Opinion in PCT/US2014/046030, mailed Oct. 21, 2014, 12 pages.

Authorized officer Agnès Wittmann-Regis, International Preliminary Report on Patentability in PCT/US2014/046030, mailed Jan. 28, 2016, 9 pages.

European Search Report in Application No. 10 81 5813.0, mailed Mar. 12, 2013, 9 pages.

Search Report and Action in TW Application No. 098132132, issued Dec. 6, 2012, 8 pages.

Search Report and Action in TW Application No. 098141930, issued Jul. 10, 2014, 7 pages.

Chinese First Office Action for Application No. 200880120050.6, Aug. 2, 2011, 10 pages.

Chinese First Office Action for Application No. 200980114639.X, May 14, 2012, 13 pages.

Ando et al., "10-W/mm AlGaN—GaN HFET with a Field Modulating Plate," IEEE Electron Device Letters, 2003, 24(5):289-291.

Arulkumaran et al., "Enhancement of Breakdown Voltage by AlN Buffer Layer Thickness in AlGaN/GaN High-electron-mobility Transistors on 4 in. Diameter Silicon," Applied Physics Letters, 2005, 86:123503-1-3.

Arulkumaran et al. "Surface Passivation Effects on AlGaN/GaN High-Electron-Mobility Transistors with $SiO_2$, $Si_3N_4$, and Silicon Oxynitride," Applied Physics Letters, 2004, 84(4):613-615.

Barnett and Shinn, "Plastic and Elastic Properties of Compositionally Modulated Thin Films," Annu. Rev. Mater. Sci., 1994, 24:481-511.

Chen et al., "High-performance AlGaN/GaN Lateral Field-effect Rectifiers Compatible with High Electron Mobility Transistors," Applied Physics Letters, 2008, 92, 253501-1-3.

Cheng et al., "Flat GaN Epitaxial Layers Grown on Si(111) by Metalorganic Vapor Phase Epitaxy Using Step-graded AlGaN Intermediate Layers," Journal of Electronic Materials, 2006, 35(4):592-598.

Coffie, "Characterizing and Suppressing DC-to-RF Dispersion in AlGaN/GaN High Electron Mobility Transistors," 2003, PhD Thesis, University of California, Santa Barbara, 169 pages.

Coffie et al., "Unpassivated p-GaN/AlGaN/GaN HEMTs with 7.1 W/mm at 10 GhZ," Electronic Letters, 2003, 39(19):1419-1420.

Chu et al., "1200-V Normally Off GaN-on-Si Field-effect Transistors with Low Dynamic On-Resistance," IEEE Electron Device Letters, 2011, 32(5):632-634.

Dora et al., "High Breakdown Voltage Achieved on AlGaN/GaN HEMTs with Integrated Slant Field Plates," IEEE Electron Device Letters, 2006, 27(9):713-715.

Dora et al., "$ZrO_2$ Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Fanciulli et al., "Structural and Electrical Properties of $HfO_2$ Films Grown by Atomic Layer Deposition on Si, Ge, GaAs and GaN," Mat. Res. Soc. Symp. Proc., 2004, vol. 786, 6 pages.

Green et al., "The Effect of Surface Passivation on the Microwave Characteristics of Undoped AlGaN/GaN HEMT's," IEEE Electron Device Letters, 2000, 21(6):268 270.

Gu et al., "AlGaN/GaN MOS Transistors using Crystalline $ZrO_2$ as Gate Dielectric," Proceedings of SPIE, 2007, vol. 6473, 64730S-1-8.

Higashiwaki et al. "AlGaN/GaN Heterostructure Field-Effect Transistors on 4H-SiC Substrates with Current-Gain Cutoff Frequency of 190 GHz," Applied Physics Express, 2008, 021103-1-3.

Hwang et al., "Effects of a Molecular Beam Epitaxy Grown AlN Passivation Layer on AlGaN/GaN Heterojunction Field Effect Transistors," Solid-State Electronics, 2004, 48:363-366.

Im et al., "Normally Off GaN MOSFET Based on AlGaN/GaN Heterostructure with Extremely High 2DEG Density Grown on Silicon Substrate," IEEE Electron Device Letters, 2010, 31(3):192-194.

Karmalkar and Mishra, "Enhancement of Breakdown Voltage in AlGaN/GaN High Electron Mobility Transistors Using a Field Plate," IEEE Transactions on Electron Devices, 2001, 48(8):1515-1521.

Karmalkar and Mishra, "Very High Voltage AlGaN/GaN High Electron Mobility Transistors Using a Field Plate Deposited on a Stepped Insulator," Solid-State Electronics, 2001, 45:1645-1652.

Keller et al., "GaN-GaN Junctions with Ultrathin AlN Interlayers: Expanding Heterojunction Design," Applied Physics Letters, 2002, 80(23):4387-4389.

Khan et al., "AlGaN/GaN Metal Oxide Semiconductor Heterostructure Field Effect Transistor," IEEE Electron Device Letters, 2000, 21(2):63-65.

Kim, "Process Development and Device Characteristics of AlGaN/GaN HEMTs for High Frequency Applications," PhD Thesis, University of Illinois at Urbana-Champaign, 2007, 120 pages.

Kumar et al., "High Transconductance Enhancement-mode AlGaN/GaN HEMTs on SiC Substrate," Electronics Letters, 2003, 39(24):1758-1760.

Kuraguchi et al., "Normally-off GaN-MISFET with Well-controlled Threshold Voltage," Phys. Stats. Sol., 2007, 204(6):2010-2013.

Lanford et al., "Recessed-gate Enhancement-mode GaN HEMT with High Threshold Voltage," Electronic Letters, 2005, 41(7):449-450.

Lee et al., "Self-aligned Process for Emitter- and Base-regrowth GaN HBTs and BJTs," Solid-State Electronics, 2001, 45:243-247.

Marchand et al., "Metalorganic Chemical Vapor Deposition on GaN on Si(111): Stress Control and Application to Filed-effect Transistors," Journal of Applied Physics, 2001, 89(12):7846-7851.

Mishra et al., "AlGaN/GaN HEMTs—An Overview of Device Operation and Applications," Proceedings of the IEEE, 2002, 90(6):1022-1031.

Nanjo et al., "Remarkable Breakdown Voltage Enhancement in AlGaN Channel High Electron Mobility Transistors," Applied Physics Letters 92 (2008), 3 pages.

Napierala et al., "Selective GaN Epitaxy on Si(111) Substrates Using Porous Aluminum Oxide Buffer Layers," Journal of the Electrochemical Society, 2006. 153(2):G125-G127, 4 pages.

Oka and Nozawa, "AlGaN/GaN Recessed MIS-gate HFET with High-threshold-voltage Normally-off Operation for Power Electronics Applications," IEEE Electron Device Letters, 2008, 29(7):668-670.

Palacios et al., "AlGaN/GaN HEMTs with an InGaN-based Back-barrier," Device Research Conference Digest, 2005, DRC '05 63rd, pp. 181-182.

Palacios et al., "AlGaN/GaN High Electron Mobility Transistors with InGaN Back-Barriers," IEEE Electron Device Letters, 2006, 27(1):13-15.

Palacios et al., "Nitride-based High Electron Mobility Transistors with a GaN Spacer," Applied Physics Letters, 2006, 89:073508-1-3.

Pei et al., "Effect of Dielectric Thickness on Power Performance of AlGaN/GaN HEMTs," IEEE Electron Device Letters, 2009, 30(4):313-315.

Tracy Frost, "Planar, Low Switching Loss, Gallium Nitride Devices for Power Conversion Applications," SBIR N121-090 (Navy), 2012, 3 pages.

Rajan et al., "Advanced Transistor Structures Based on N-face GaN," 32M International Symposium on Compound Semiconductors (ISCS), Sep. 18-22, 2005, Europa-Park Rust, Germany, 2 pages.

Reiher et al., "Efficient Stress Relief in GaN Heteroepitaxy on Si(111) Using Low-temperature AlN Interlayers," Journal of Crystal Growth, 2003, 248:563-567.

Saito et al., "Recessed-gate Structure Approach Toward Normally Off High-voltage AlGaN/GaN HEMT for Power Electronics Applications," IEEE Transactions on Electron Device, 2006, 53(2):356-362.

(56) References Cited

OTHER PUBLICATIONS

Shelton et al., "Selective Area Growth and Characterization of AlGaN/GaN Heterojunetion Bipolar Transistors by Metalorganic Chemical Vapor Deposition," IEEE Transactions on Electron Devices, 2001, 48(3):490-494.

Shen, "Advanced Polarization-based Design of AlGaN/GaN HEMTs," Jun. 2004, PhD Thesis, University of California, Santa Barbara, 192 pages.

Sugiura et al., "Enhancement-mode *n*-channel GaN MOSFETs Fabricated on *p*-GaN Using $HfO_2$ as Gate Oxide," Electronics Letters, 2007, vol. 43, No. 17, 2 pages.

Suh et al. "High-Breakdown Enhancement-mode AlGaN/GaN HEMTs with Integrated Slant Field-Plate," Electron Devices Meeting, 2006, IEDM '06 International, 3 pages.

Tipirneni et al. "Silicon Dioxide-encapsulated High-Voltage AlGaN/GaN HFETs for Power-Switching Applications," IEEE Electron Device Letters, 2007, 28(9):784-786.

Vetury et al., "Direct Measurement of Gate Depletion in High Breakdown (405V) Al/GaN/GaN Heterostructure Field Effect Transistors," IEDM 98, 1998, pp. 55-58.

Wang et al., "Comparison of the Effect of Gate Dielectric Layer on 2DEG Carrier Concentration in Strained AlGaN/GaN Heterostructure," Mater. Res. Soc. Symp. Proc., 2007, vol. 831, 6 pages.

Wang et al., "Enhancement-mode $Si_3N_4$/AlGaN/GaN MISHFETs," IEEE Electron Device Letters, 2006, 27(10):793-795.

Wu, "AlGaN/GaN Microwave Power High-Mobility Transistors," PhD Thesis, University of California, Santa Barbara, Jul. 1997, 134 pages.

Wu et al., "A 97.8% Efficient GaN HEMT Boost Converter with 300-W Output Power at 1 MHz," Electronic Device Letters, 2008, IEEE, 29(8):824-826.

Yoshida, "AlGan/GaN Power FET," Furukawa Review, 2002, 21:7-11.

Zhang, "High Voltage GaN HEMTs with Low On-resistance for Switching Applications," PhD Thesis, University of California, Santa Barbara, Sep. 2002, 166 pages.

Zhanghong Content, Shanghai Institute of Metallurgy, Chinese Academy of Sciences, "Two-Dimensional Electron Gas and High Electron Mobility Transistor (HEMT)," Dec. 31, 1984, 17 pages.

* cited by examiner

GATE STRUCTURES FOR III-N DEVICES

CROSS-REFERENCE TO RELATED APPLICATION

This application claims priority to U.S. Provisional Application No. 62/092,732, filed on Dec. 16, 2014. The disclosure of the prior application is considered part of and is incorporated by reference in the disclosure of this application.

TECHNICAL FIELD

This specification relates to semiconductor devices, in particular nitride-based devices such as transistors that include a recess into which a gate electrode is deposited.

BACKGROUND

Transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). While Si power devices are inexpensive, they can suffer from a number of disadvantages, including relatively low switching speeds and high levels of electrical noise. More recently, silicon carbide (SiC) power devices have been considered due to their superior properties. III-Nitride or III-N semiconductor devices, such as gallium nitride (GaN) devices, are now emerging as attractive candidates to carry large currents, support high voltages, and to provide very low on-resistance and fast switching times.

Multi-finger transistors can be made using III-N semiconductor technology. Some multi-finger transistors include multiple source and drain electrodes ("fingers") that are arranged in parallel to each other and interdigitated. One or more gate electrodes separate the source and drain electrodes and can be used, e.g., to turn a multi-finger transistor on and off.

SUMMARY

In one aspect, a method of fabricating a semiconductor device includes forming a III-N layer on a substrate and forming a plurality of parallel conductive fingers on the III-N layer. The forming of the plurality of parallel conductive fingers includes forming a source bus and a drain bus, forming a plurality of source fingers coupled to the source bus and extending from the source bus towards the drain bus to respective source finger ends, and forming a plurality of drain fingers coupled to the drain bus and extending from the drain bus towards the source bus to respective drain finger ends, wherein the drain fingers are interdigitated between the source fingers. The method further includes forming an insulator layer over the III-N layer, etching a gate recess in the insulator layer, cleaning the gate recess using a chemical cleaning process, and forming a gate over the gate recess. The gate recess comprises a plurality of straight sections and a plurality of connecting sections. Each straight section lies between a source finger and an adjacent drain finger and has a substantially uniform length along a direction of current flow of the semiconductor device. Each connecting section joins two adjacent straight sections and has at least a portion with a length greater than the substantially uniform length of the two adjacent straight sections.

In another aspect, a semiconductor device includes a III-N layer and a plurality of parallel conductive fingers on the III-N layer. The plurality of parallel conductive fingers includes a source bus and a drain bus, a plurality of source fingers coupled to the source bus and extending from the source bus towards the drain bus to respective source finger ends, and a plurality of drain fingers coupled to the drain bus and extending from the drain bus towards the source bus to respective drain finger ends, wherein the drain fingers are interdigitated between the source fingers. The device further includes an insulator layer over the III-N layer, as well as a gate. The gate comprises a plurality of straight sections and a plurality of connecting sections. Each straight section lies between a source finger and an adjacent drain finger and has a substantially uniform length along a direction of current flow of the semiconductor device. Each connecting section joins two adjacent straight sections and has at least a portion with a length greater than the substantially uniform length of the two adjacent straight sections.

Devices and methods described herein may each include one or more of the following features. The connecting sections of the gate may curve continuously around a respective source finger end or drain finger end. Forming the III-N layer can include forming a III-N channel layer and a III-N barrier layer, wherein a compositional difference between the III-N channel layer and the III-N barrier layer causes a 2DEG channel to be induced in the III-N channel layer adjacent to the III-N barrier layer. Additionally, ions can be implanted into the III-N layer in one or more peripheral edge regions underneath the connecting sections of the gate recess, thereby causing the 2DEG channel not to be induced in the peripheral edge regions. Etching the gate recess can also include etching the gate recess, in one or more peripheral edge regions underneath the connecting sections of the gate recess, to a depth sufficient to cause the 2DEG channel not to be induced underneath the gate in the peripheral edge regions.

Etching the gate recess may include etching the gate recess to leave slanted sidewalls for the gate. The gate can be partially deposited prior to performing the chemical cleaning process and can be completely deposited after performing the chemical cleaning process. Forming the insulator layer may include forming a gate insulator layer over the III-N layer, an etch stop layer over the gate insulator layer, and an electrode defining layer over the etch stop layer. Etching the gate recess can include etching the gate recess, in an active region underneath the straight sections, to a depth into the etch stop layer. The gate insulator layer can comprise silicon nitride, the etch stop layer can comprise aluminum nitride, and the electrode defining layer can comprise silicon nitride. Each connecting section can be a curved section which curves around a respective source finger end or drain finger end.

The III-N layer can include a III-N channel layer and a III-N barrier layer, wherein a compositional difference between the III-N channel layer and the III-N barrier layer causes a 2DEG channel to be induced in the III-N channel layer adjacent to the III-N barrier layer. Devices may include ions implanted into one or more peripheral edge regions underneath the connecting sections of the gate, thereby causing the 2DEG channel not to be induced in the peripheral edge regions. The gate may comprise slanted sidewalls. A recess can be included in the insulator layer, and the gate may be in the recess.

A length of a portion of the recess beneath the plurality of connecting sections can be greater than a length of the recess in a direction of current flow beneath the plurality of straight sections. The insulator layer can include a gate insulator layer over the III-N layer, an etch stop layer over the gate insulator layer, and an electrode defining layer over the etch stop layer. The gate can be recessed, in an active region underneath the straight sections, to a depth into the etch stop layer.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Figure 1:
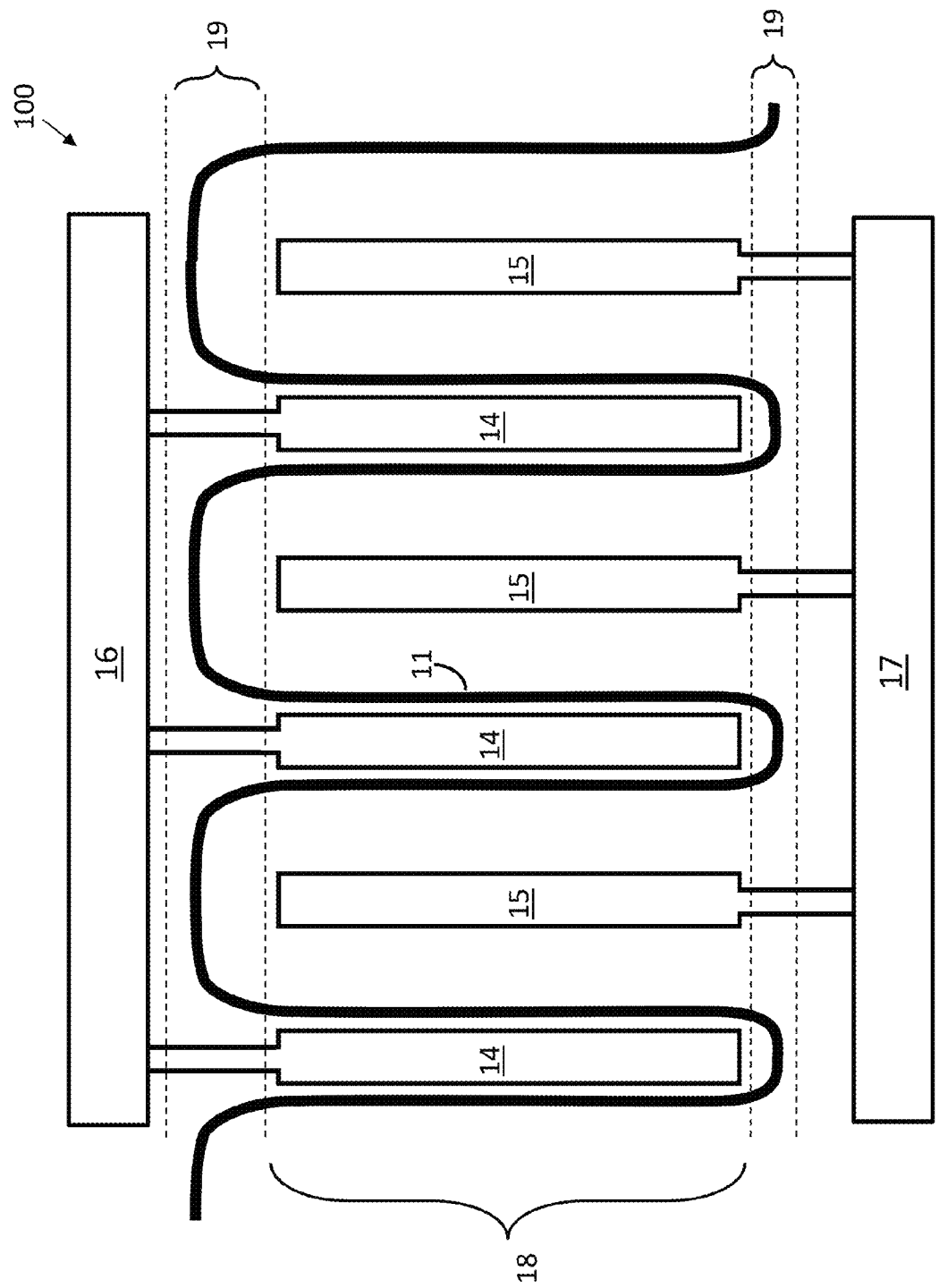
FIG. 1 is an overhead view of an example of a conventional semiconductor device.

FIG. 1 is an overhead view of an example of a conventional semiconductor device 100. The device 100 includes a source bus 16, a drain bus 17, and a number of parallel conductive fingers 14 and 15.

The source bus 16 is coupled to a number of source fingers 14. The source fingers 14 extend from the source bus 16 towards the drain bus 17. The drain bus 17 is coupled to a number of drain fingers 15. The drain fingers 15 extend from the drain bus 17 towards the source bus 16. The drain fingers 15 are interdigitated between the source fingers 14. A gate 11 wraps around each of the parallel conductive fingers 14 and 15. The source bus 16 is electrically isolated from the drain bus 17 by the gate 11 while the device 100 is biased off (i.e., when the gate 11 is biased relative to the source 14/16 at a voltage which is less than the threshold voltage of the device 100).

In operation, applying a voltage to the gate 11 relative to the source 14/16 can turn the device on and off, thereby allowing current to flow, or blocking current from flowing, from the source fingers 14 to the drain fingers 15. Electron current flows from each source finger 14 in two directions to the two drain fingers 15 adjacent the source finger 14 (except for any source and/or drain fingers at the edges of the device 100, each of which only has 1 adjacent drain/source finger).

The device 100 includes an active region 18 through which current flows. The active region 18 is defined by the region where the gate 11 is adjacent to the source fingers 14. The device 100 also includes a non-active region, e.g., a peripheral edge region 19, in which current does not typically flow and/or only flows in small amounts. In the peripheral edge region 19, the segments of the active gate portions (e.g., the segments that are closest to their respective source fingers) are connected to one another.

Fabricating the device 100 can include etching a recess for the gate 11 into an insulator layer on top of the device. Prior to depositing the gate 11 into the recess, a chemical cleaning process can performed, e.g., by flushing a solvent into the recess and over the rest of the device, and then rinsing the recess and the rest of the device with deionized water. The cleaning process can result in residue and/or water marks in the recess in the peripheral edge region 19, which consequently can cause the gate metal in the peripheral edge region 19 to delaminate. Delamination of the gate metal can result in the channel beneath the gate in the delaminated regions not fully pinching off when the device is biased off, thereby causing increased off state current leakage in the device 100, e.g., gate to drain leakage and/or source to drain leakage. Alternatively, the channel beneath the gate in the delaminated regions may pinch off at a substantially lower gate voltage than the rest of the device, which can either cause increased off state current leakage or cause a decrease in the device threshold voltage. A much higher level of gate metal delamination tends to occur in the peripheral edge region 19, where the gate curves around the edge of the source and drain fingers, as compared to in the active region 18, where the gate 11 is straight and runs parallel to the source fingers 14. In some cases, no substantial amount of gate metal delamination occurs in the active region 18, while some delamination occurs in the peripheral edge region 19.

Figure 2A:
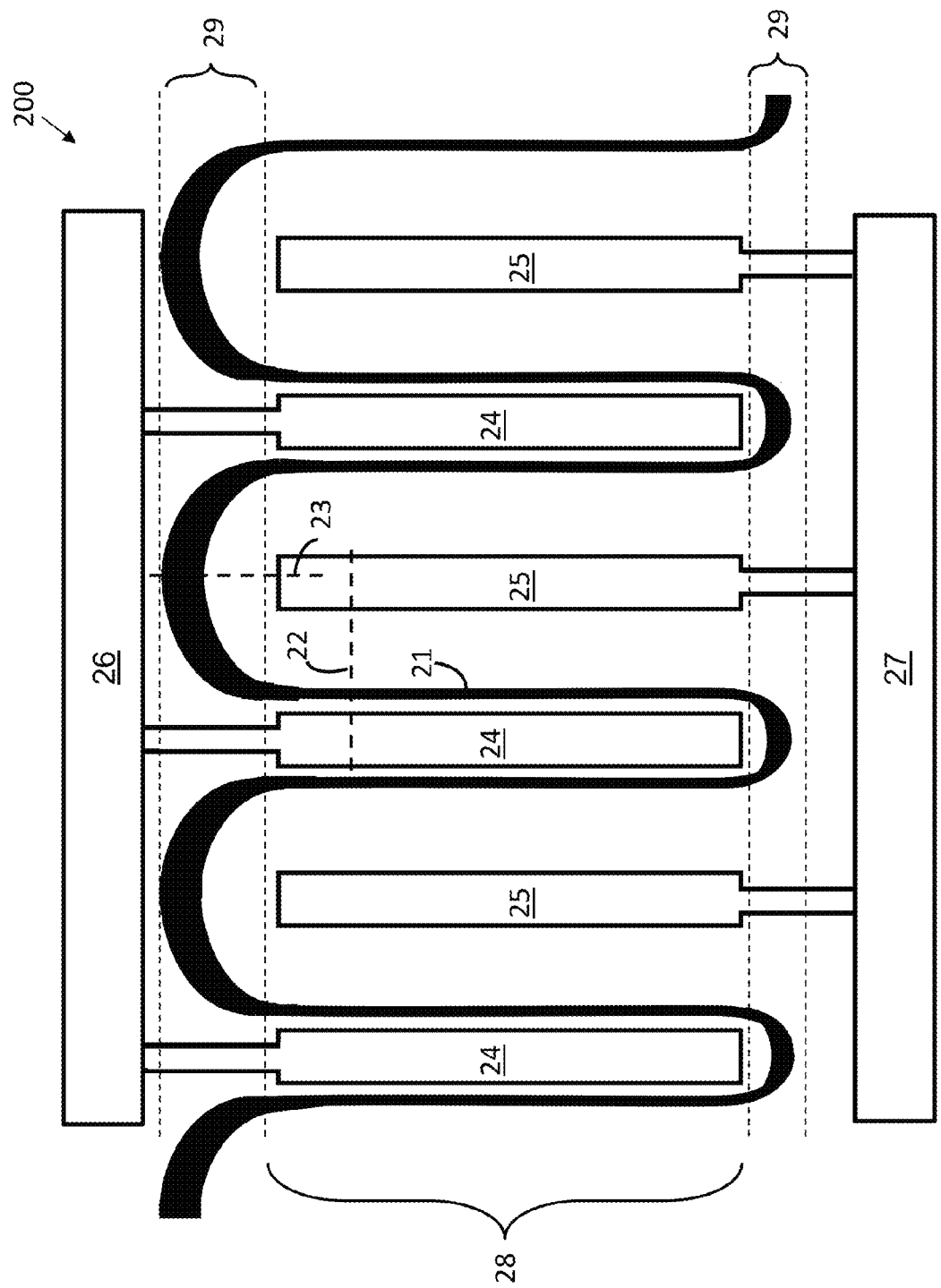
FIG. 2A is an overhead view of an example semiconductor device.

FIG. 2A is an overhead view of an example semiconductor device 200. Similar to the device 100 of FIG. 1, the device 200 includes a source bus 26, a drain bus 27, a number of source fingers 24, a number of drain fingers 25, and a gate 21. The device 200 includes an active region 28 and a peripheral edge region 29.

Figure 2B:
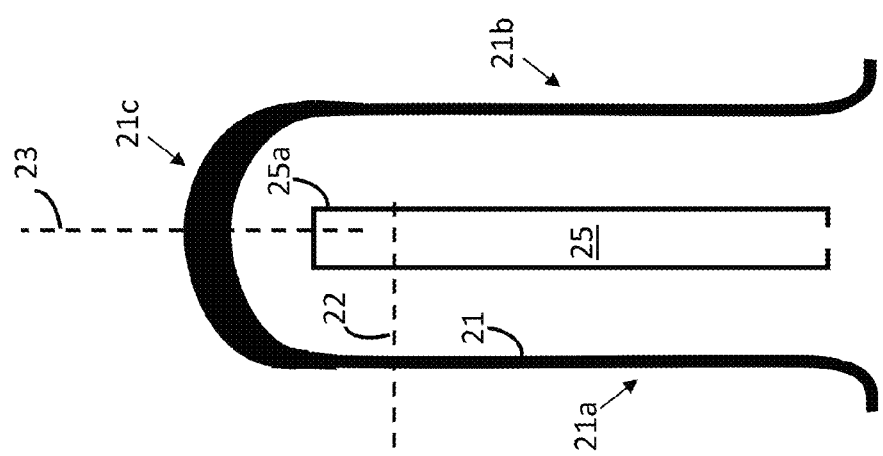
FIG. 2B is an isolated view of one of the drain fingers illustrating the shape of the gate as the gate winds around the drain finger.

FIG. 2B is an isolated view of one of the drain fingers 25 illustrating the shape of the gate 21 as the gate winds around the drain finger 25. The gate 21 includes straight sections 21a-b that run parallel to the drain finger 25. The gate 21 also includes a curved connecting section 21c that curves around an end 25a of the drain finger and joins the straight sections 21a-b.

The straight sections 21a-b, which are generally located in the active region 28 of the device 200, have a substantially uniform length along the horizontal dashed line 22, i.e., along the direction of current flow during operation of the semiconductor device. The connecting section 21c, which is generally located in the peripheral edge region 29 of the device 200, has at least a portion with a length (e.g., along the vertical dashed line 23, which could be considered a width) greater than the length of the straight sections 21a-b. As seen in FIG. 2B, the connecting section of the gate 21c includes a first edge proximal to the adjacent drain (or source) finger and a second edge opposite the first edge, and the direction in which the length of the gate 21 is measured is a direction substantially perpendicular to the first and second edge. In some implementations, the curved connecting section 21c curves continuously from one straight section 21a to the other 21b. The length of the curved section 21c (i.e., the length along a direction substantially perpendicular to the first and second edges) can expand gradually to an intermediate point between the straight sections 21a-b.

The device 200 performance can be affected by the gate length of the straight sections 21a-b in the active region 28, where current flows, but is typically not affected by the gate length (i.e., the length along a direction substantially perpendicular to the first and second edges) of the curved section 21c in the non-active peripheral edge regions 29, through which current does not typically flow. Thus, expanding the gate 21 in the curved connecting section 21c in the non-active peripheral edge regions 29 of the device need not increase the footprint of the device or degrade device performance.

Expanding the gate 21 in the curved connecting section 21c can be useful, e.g., so that a chemical cleaning process can be used in a gate recess without resulting in residue or watermarks in the gate recess. Alternatively, expanding the gate 21 in the curved section 21c may cause a reduction in residue or watermarks in the gate recess in the curved section 21c. This can prevent the gate metal from delaminating in the non-active peripheral edge regions 29 and result in a reduction in device leakage and an increase in wafer yield.

Figure 3:
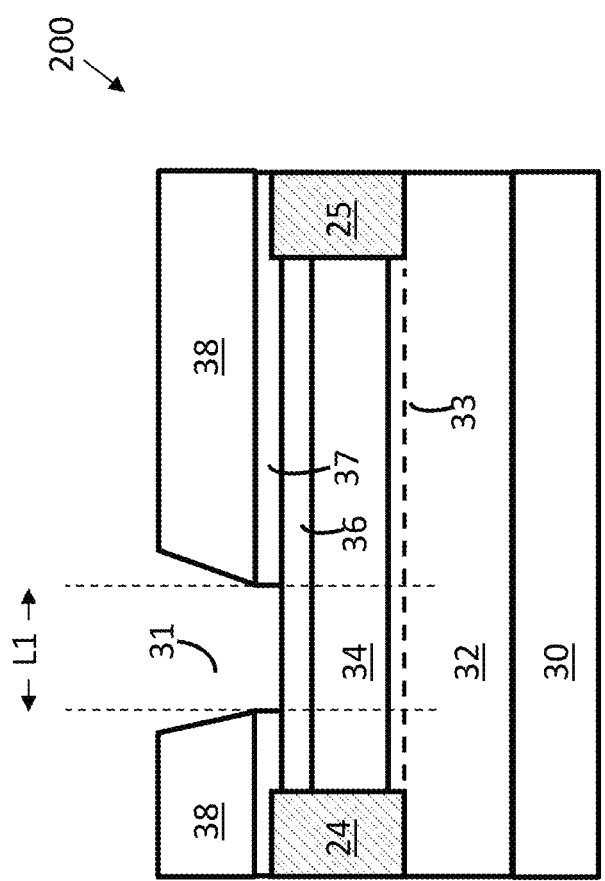
FIGS. 3 and 4 are cross-sectional views of the device along the horizontal dashed line in FIGS. 2A-B.
Figure 4:
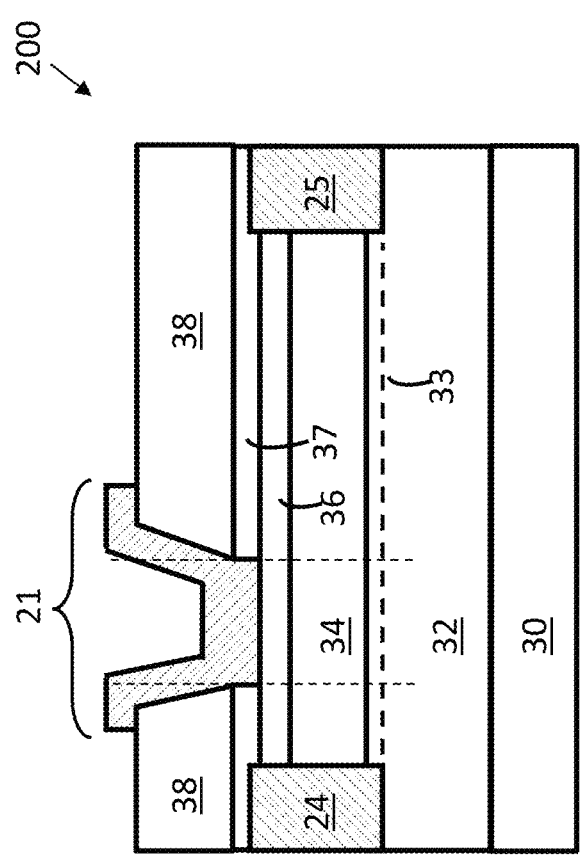

FIGS. 3 and 4 are cross-sectional views of the device 200 along the horizontal dashed line 22 in FIGS. 2A-B. FIG. 3 is a cross-sectional view of the device 200 in the active region 28 prior to depositing the gate 21 in a gate recess 31. FIG. 4 is a cross-section view of the device 200 after depositing the gate 21.

The device 200 includes the source finger 24, the gate 21, and the drain finger 25 in the active region 28. The device 200 includes a substrate 30, e.g., a silicon substrate. The device 200 also includes a III-N layer including a III-N channel layer 32 and a III-N barrier layer 34. A conductive 2DEG channel 33 is induced in the channel layer 32 due to a compositional difference between the channel layer 32 and the barrier layer 34. Source and drain fingers 24 and 25 electrically contact the 2DEG channel 33.

As used in this document, the terms III-Nitride or III-N materials, layers, devices, and structures refer to a material, device, or structure comprised of a compound semiconductor material according to the stoichiometric formula $B_wAl_xIn_yGa_zN$, where w+x+y+z is about 1, and w, x, y, and z are each greater than or equal to zero and less than or equal to 1. In a III-Nitride or III-N device, the conductive channel can be partially or entirely contained within a III-N material layer.

The device includes an insulator layer over the III-N layers, and the insulator layer can include a gate insulator layer 36 (for example silicon nitride deposited by MOCVD), an etch stop layer 37 (for example aluminum nitride), and an electrode defining layer 38 (for example silicon nitride deposited by PECVD). The etch stop layer 37 can optionally be omitted, and/or the entire stack of insulator layers 36, 37, and 38 can optionally be formed of a single material as a single insulator layer. The insulator layer can be a passivation layer, preventing or suppressing dispersion by preventing or suppressing voltage fluctuations at the uppermost III-N surface.

The gate recess 31 is etched into the insulator layer to a depth up to the etch stop layer 37, or may optionally be etched through the entirety of the insulator layer to exposed a surface of the underlying III-N material (not shown). In other implementations, the recess may also extend into the underlying III-N material (also not shown). As indicated in FIG. 3, the gate recess 31 has a length L1. The gate recess 31 can have slanted sidewalls in the electrode defining layer 38 so that the gate 21 can be formed in the gate recess 31 with slanted sidewalls. The slanted sidewalls can be useful, e.g., as a field plate to shape the electric field in the device 200 in such a way that reduces the peak electric field and increases the device breakdown voltage, thereby allowing for higher voltage operation.

Figure 5:
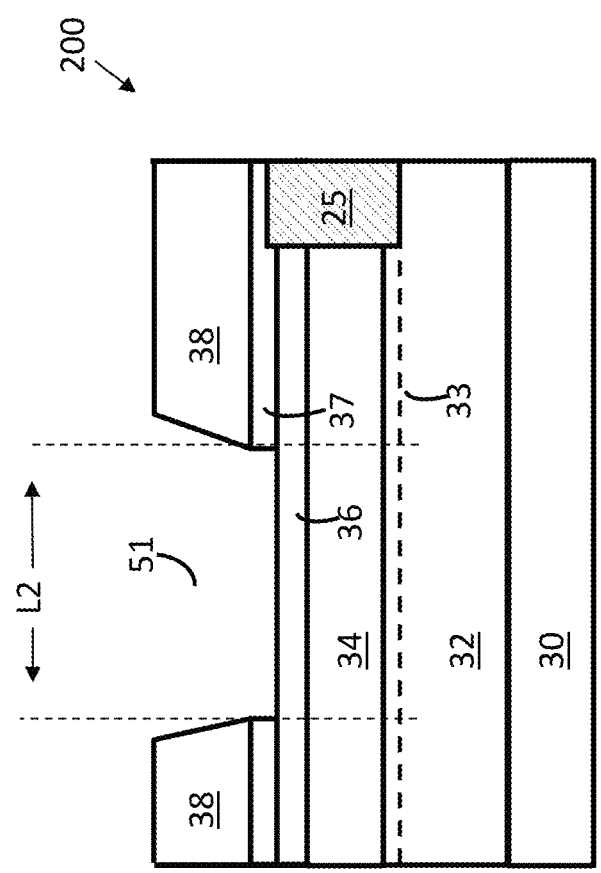
FIGS. 5 and 6 are cross-sectional views of the device along the vertical dashed line in FIGS. 2A-B.
Figure 6:
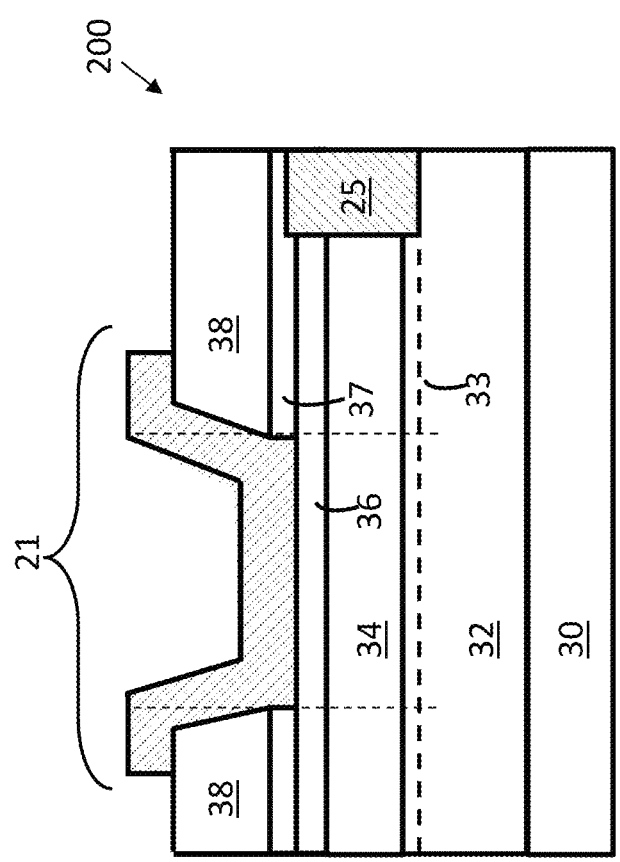

FIGS. 5 and 6 are cross-sectional views of the device 200 along the vertical dashed line 23 in FIGS. 2A-B. FIG. 5 is a cross-sectional view of the device 200 in the non-active peripheral edge region 29 prior to depositing the gate 21 in the portion of the gate recess 51 in the non-active peripheral edge region 29. FIG. 6 is a cross-section view of the device 200 in the non-active peripheral edge region 29 after depositing the gate 21. As indicated in FIG. 5, the gate recess 51 in the non-active peripheral edge region 29 has a length L2 which is greater than the length L1 of the gate recess 31 in the active region 28 as illustrated in FIG. 3. The gate recess 51 in the non-active peripheral edge region 29 can also have slanted sidewalls.

Figure 7:
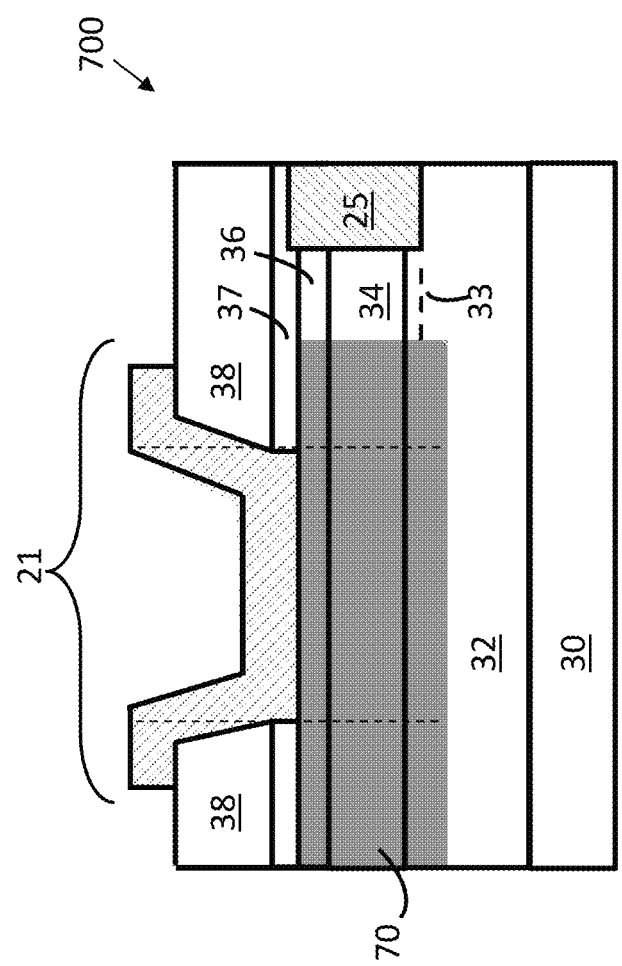
FIG. 7 is a cross-sectional view of the device of FIGS. 2A and 2B along the vertical dashed line with an optional modification.

FIG. 7 is a cross-sectional view of the device 200 along the vertical dashed line 23 with an optional modification. As modified, ions are implanted into the device in portion 70 of peripheral edge region 29, such that there is no 2DEG channel in peripheral edge region 29. The ions can be, e.g., argon ions. This can serve to electrically isolate adjacent devices on a wafer from one another or to further reduce gate leakage in the device. Another way to accomplish that effect is to etch the gate recess to a depth through the 2DEG channel in the peripheral edge region 29.

Figure 8:
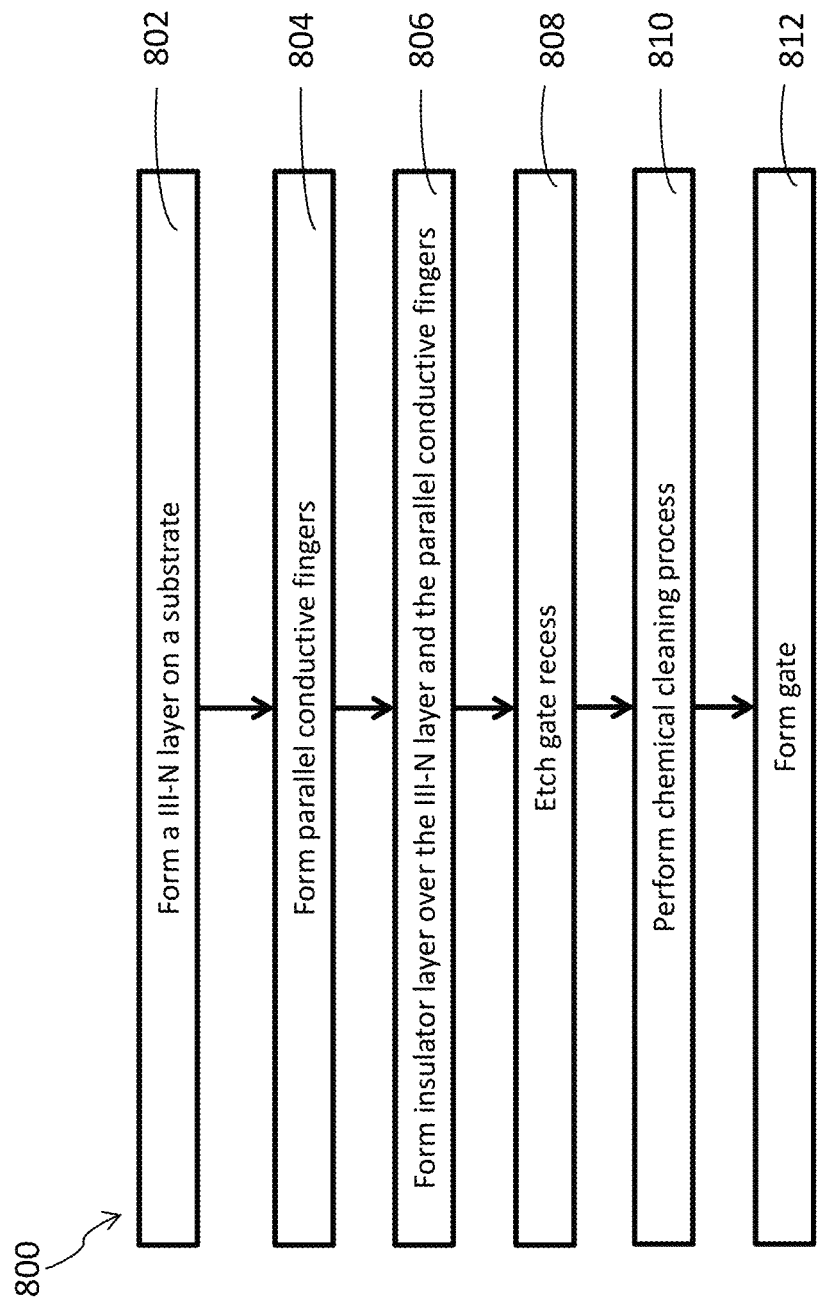
FIG. 8 is a flow diagram of an example process for fabricating a semiconductor device.

FIG. 8 is a flow diagram of an example process 800 for fabricating a semiconductor device. The process 800 can be used, e.g., to fabricate the device 200 of FIG. 2A.

A III-N layer is formed on a substrate (802). The substrate can be a silicon wafer. The III-N layer can be formed by either directly growing the III-N layer on the substrate, or alternatively by growing the III-N layer or parts of the III-N layer on a first substrate, detaching the III-N layer from the first substrate, and bonding the III-N layer to the substrate. Forming the III-N layer can include using any appropriate deposition process.

Parallel conductive fingers are formed on the III-N layer (804). A source bus and a drain bus are added, or are optionally formed at the same time as the source and drain fingers. The conductive fingers include source fingers, which extend from the source bus towards the drain bus to a source finger end, and drain fingers, which are coupled to the drain bus and extend from the drain bus towards the source bus to a drain finger end. The drain fingers are interdigitated between the source fingers.

In some implementations, ions are implanted into the III-N layer in one or more peripheral edge regions underneath the curved sections of the gate recess, causing the 2DEG channel not be induced in the peripheral edge regions. The ions may be implanted prior to forming the source and drain bus and/or before forming the source and drain fingers. An insulator layer is formed over the III-N layer, and optionally over the parallel conductive fingers (806).

A gate recess is etched into the insulator layer (808). Any appropriate etching process can be used. Typically a resist pattern is used so that the gate recess includes straight sections and curved connecting sections. Each straight section lies between a source finger and an adjacent drain finger and has a substantially uniform length. Each curved connecting section joins two adjacent straight sections and curves around a source finger end or a drain finger end, e.g., curves continuously.

In some implementations, the gate recess is etched, in one or more peripheral edge regions underneath the curved connecting sections of the gate recess, to a depth sufficient to cause the 2DEG channel not to be induced in the peripheral edge regions beneath the gate. In some implementations, the gate recess is etched to leave slanted sidewalls for the gate.

A chemical cleaning process is performed (810). A solvent can be flushed into the gate recess and then deionized water can be used to rinse the gate recess. A gate is formed in the gate recess (812). In some implementations, the gate is partially deposited prior to performing the chemical cleaning process and completed after performing the chemical cleaning process.

Figure 9:
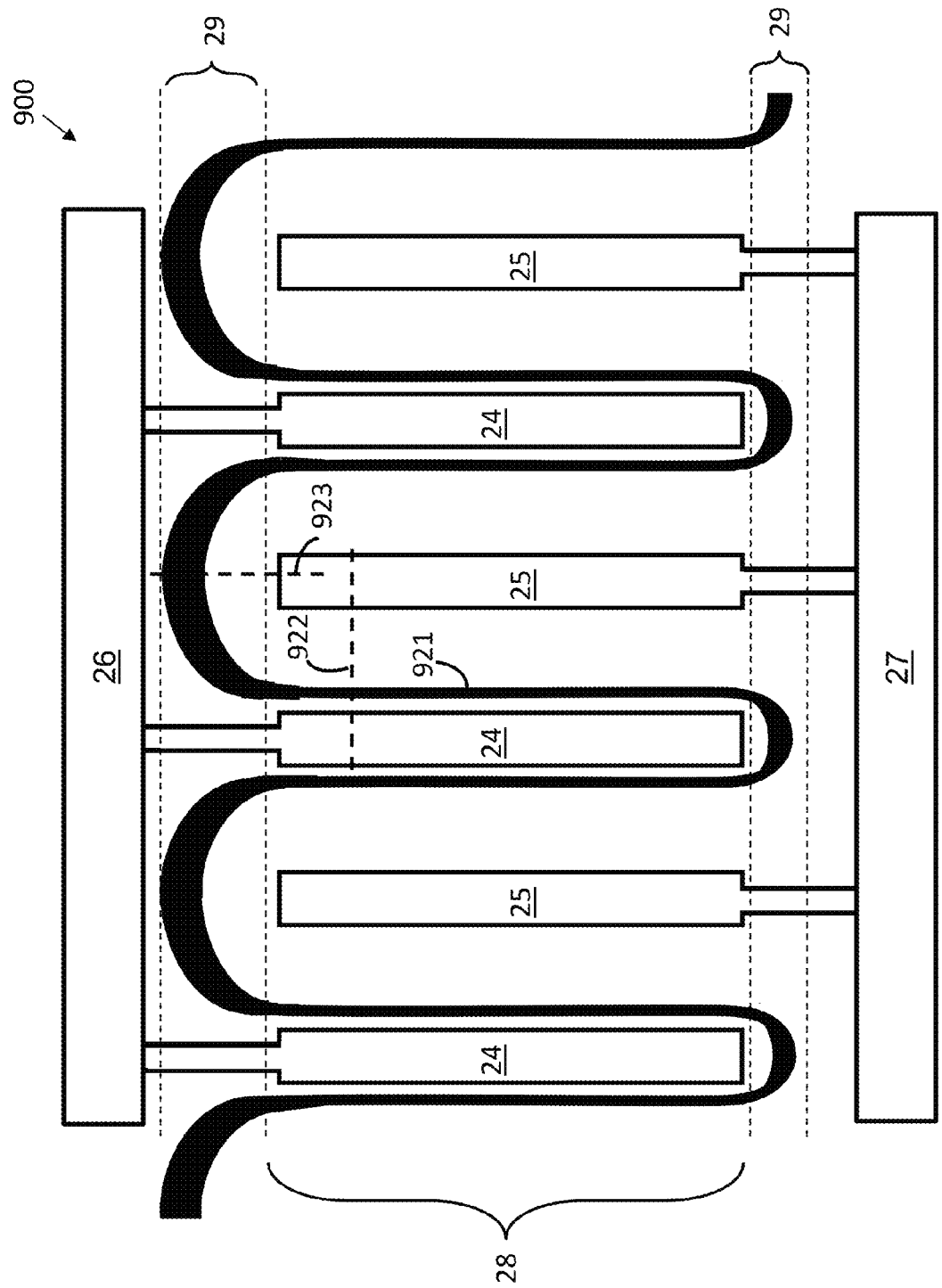
FIG. 9 is an overhead view of another example semiconductor device.
Figure 10:
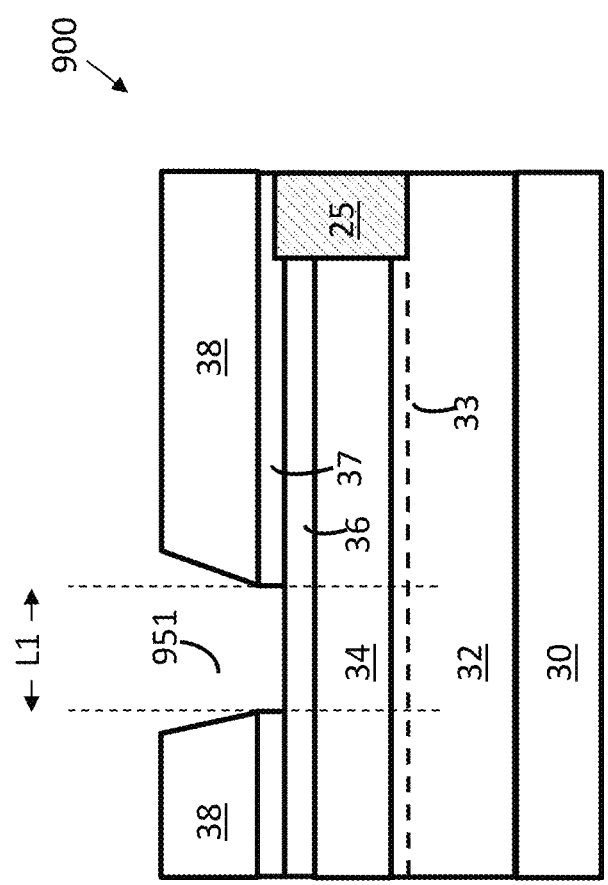
FIGS. 10 and 11 are cross-sectional views along the vertical dashed line in FIG. 9.
Figure 11:
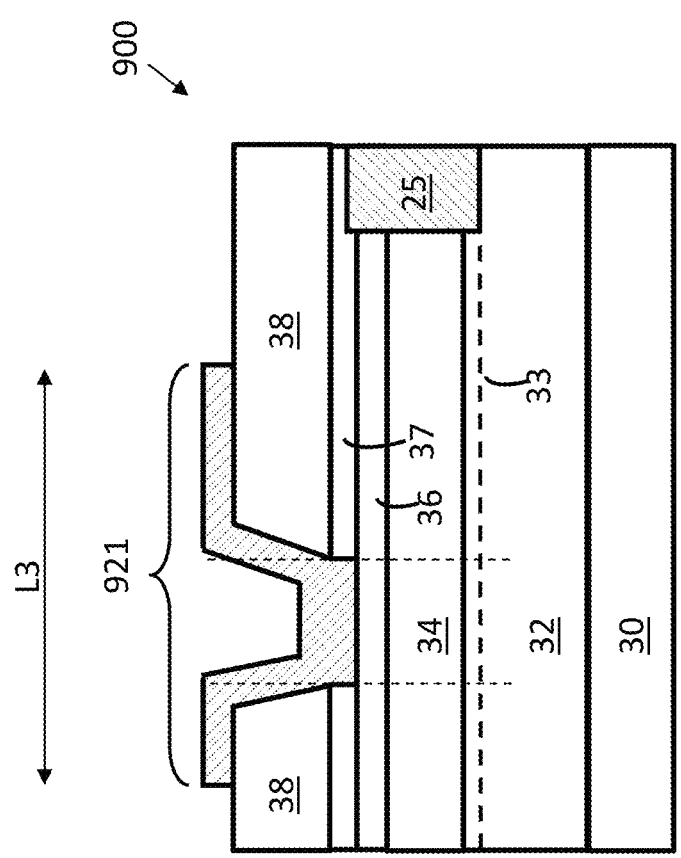
Figure 12:
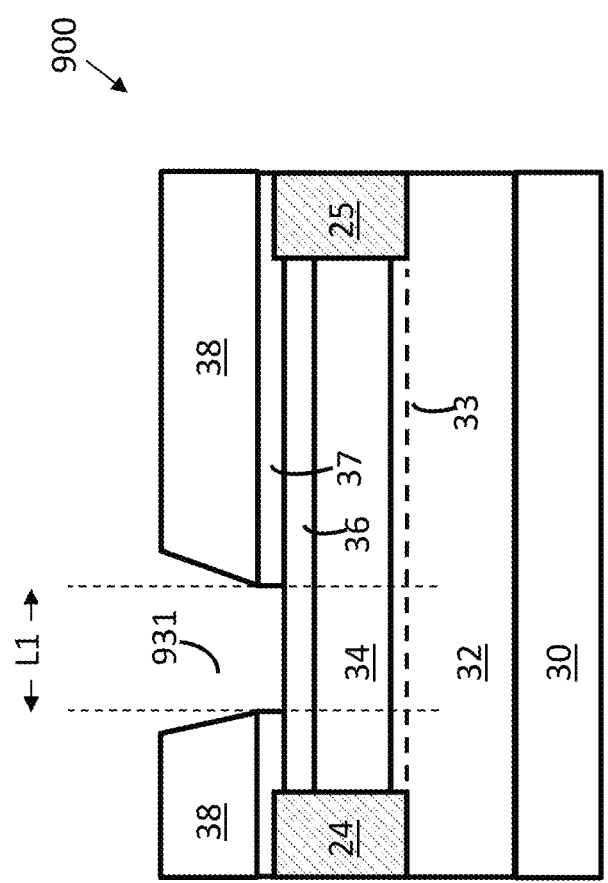
FIGS. 12 and 13 are cross-sectional views along the horizontal dashed line in FIG. 9.
Figure 13:
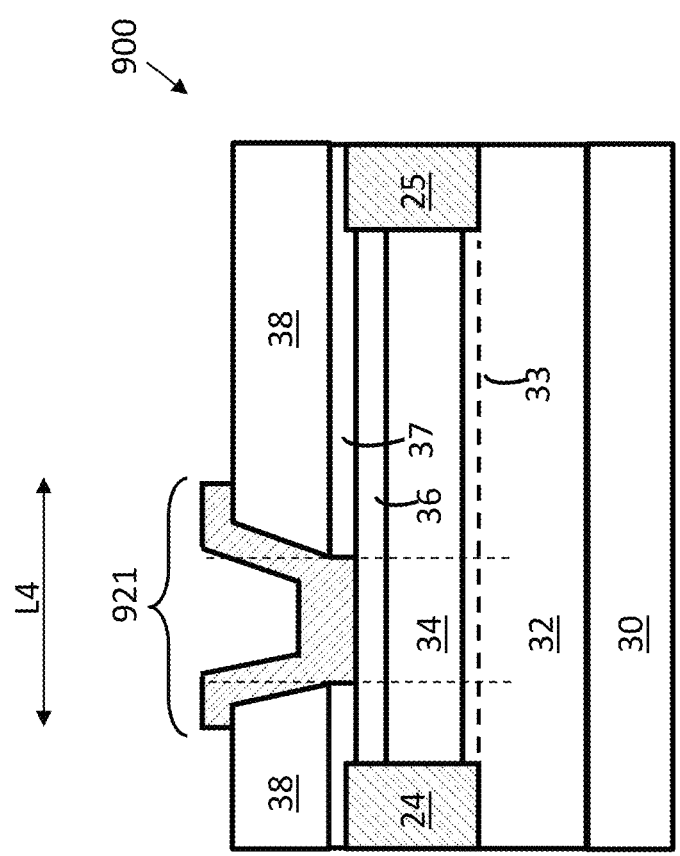

FIG. 9 is a plan view (overhead view) of another example semiconductor device 900. FIGS. 10 and 11 are cross-sectional views along the vertical dashed line 923 in FIG. 9, and FIGS. 12 and 13 are cross-sectional views along the horizontal dashed line 922 in FIG. 9. FIG. 10 is a cross-sectional view of the device 900 in the non-active peripheral edge region 29 prior to depositing the gate 921 in the portion of the gate recess 951 in the non-active peripheral edge region 29 of device 900. FIG. 11 is a cross-section view of the device 900 in the non-active peripheral edge region 29 after depositing the gate 921. FIG. 12 is a cross-sectional view of the device 900 in the active region 28 prior to depositing the gate 921 in the portion of the gate recess 931 which is in the active region 28. FIG. 13 is a cross-section view of the device 900 in the active region 28 after depositing the gate 921. As indicated in FIG. 10, the gate recess 931 in the non-active peripheral edge region 29 has a length L1, which is substantially the same length as the gate recess 931 in the active region 28 (illustrated in FIG. 12). The gate recess 931 in the non-active peripheral edge region 29 can also have slanted sidewalls.

In the device 900 of FIGS. 9-13, water marks may still form in the recess in the peripheral edge region 29, since the recess has not been made wider in these regions. However, as seen in FIGS. 9, 11, and 13, the length L3 of the electrode 921 in a direction away from the drain in the peripheral edge region 29 is larger than the corresponding length L4 in the active region 28. In other words, although the recess 931 in the active region 28 has the same length L1 as the recess 951 in the peripheral edge region 29, a substantially larger percentage of the gate electrode 921 is outside the recess in the peripheral edge region 29 as compared to in the active region 28. This may also serve to prevent the delamination of the gate metal in the peripheral edge region 29, even if residue and/or watermarks are still present, thereby preventing an increase in off-state leakage currents and allowing the device to function properly.

Figure 14:
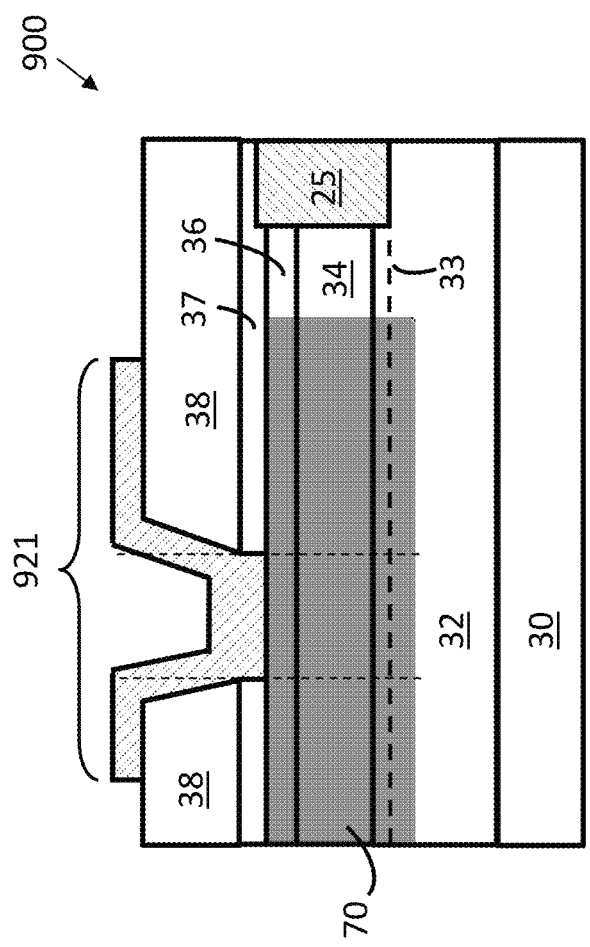
FIG. 14 is a cross-sectional view of the device of FIG. 9 along the vertical dashed line with an optional modification.

FIG. 14 is a cross-sectional view of device 900 along the vertical dashed line 923 with an optional modification. As modified, ions are implanted into the device in portion 70 of peripheral edge region 29, such that there is no 2DEG channel in peripheral edge region 29. The ions can be, e.g., argon ions. This can serve to electrically isolate adjacent devices on a wafer from one another or to further reduce gate leakage in the device. Another way to accomplish that effect is to etch the gate recess to a depth through the 2DEG channel in the peripheral edge region 29.

Figure 15:
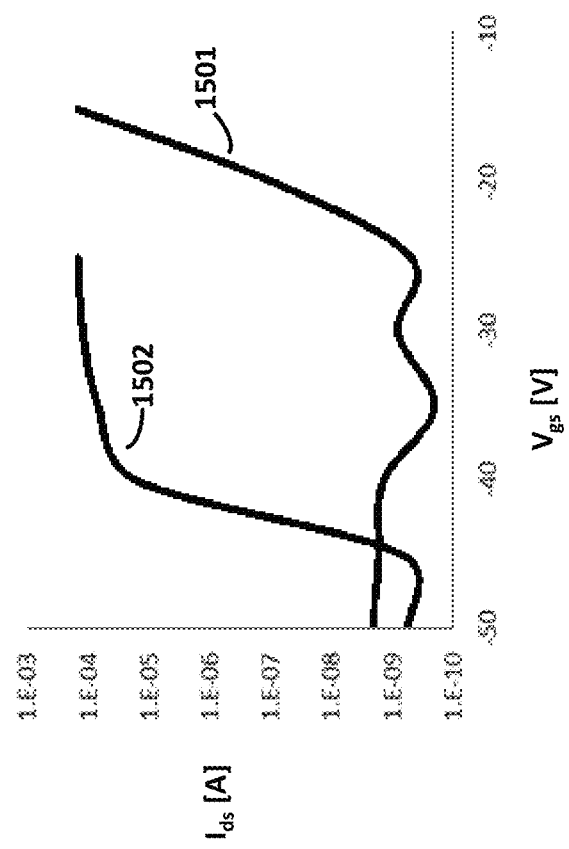
FIG. 15 is a graph of example I-V characteristics for a properly functioning device and an improperly functioning device.

FIG. 15 is a graph of current-voltage (I-V) characteristics 1501 and 1502 for two different transistors which are each designed to have a threshold voltage of about −25 V. The x-axis is the gate-source voltage $V_{gs}$, measured in Volts, and the y-axis is the drain-source current $I_{ds}$, measured in Amps. For these measurements, the drain-source voltage Vas was held constant. The device corresponding to curve 1501 exhibited no delamination of the gate electrode and functioned properly. As shown, $I_{ds}$ remained small when $V_{gs}$ was less than or equal to the threshold voltage and then increased when $V_{gs}$ was greater than the threshold voltage. The device corresponding to curve 1502, on the other hand, exhibited some delamination of the gate electrode in the non-active peripheral edge region of the device and exhibited increased leakage currents at sub-threshold gate-source voltages. As shown, when $V_{gs}$ was less than about −45 V, the device 1502 exhibited similar off-state leakage currents to the properly function device 1501. However, the off-state leakage current when $V_{gs}$ was between −45 V and −25 V was substantially higher for the device corresponding to curve 1502 than that corresponding to curve 1501.

The inventors performed controlled experiments in which they fabricated a first set of devices with the structure shown in FIG. 1, a second set of devices with the structure shown in FIGS. 2-6, and a third set of devices with the structure shown in FIGS. 9-13. As compared to the first set of devices, a substantially smaller percentage of the second and third set of devices experienced increased subthreshold leakage currents in a manner similar to example curve 1502. Thus widening the gate electrode and optionally the gate recess in the peripheral edge regions of the device caused a substantial reduction in the number of devices exhibiting increased subthreshold leakage currents.

A number of implementations have been described. Nevertheless, it will be understood that various modifications may be made without departing from the spirit and scope of the techniques and devices described herein. For example, implanting ions into the non-active peripheral edge regions, as in FIGS. 7 and 14, may alleviate the need for widening the gate electrode and/or the gate recess in the peripheral edge regions of the device. Accordingly, other implementations are within the scope of the following claims.

What is claimed is:

1. A method of fabricating a semiconductor device, the method comprising:
   forming a III-N layer on a substrate;
   forming a plurality of parallel conductive fingers on the III-N layer, including forming:
     a source bus and a drain bus;
     a plurality of source fingers coupled to the source bus and extending from the source bus towards the drain bus to respective source finger ends; and
     a plurality of drain fingers coupled to the drain bus and extending from the drain bus towards the source bus to respective drain finger ends, wherein the drain fingers are interdigitated between the source fingers;
   forming an insulator layer over the III-N layer;
   etching a gate recess in the insulator layer, the gate recess comprising:
     a plurality of straight sections, each straight section lying between a source finger and an adjacent drain finger and having a substantially uniform length along a direction of current flow of the semiconductor device;
     a plurality of connecting sections, each connecting section joining two adjacent straight sections at joining points, each connecting section including a first edge proximal to a respective source finger end or drain finger end and a second edge opposite the first edge, wherein a length of the connecting section, measured in a direction substantially perpendicular to the first and second edges, gradually expands from a value of the substantially uniform length of the two adjacent straight sections at the joining points to a larger value at one or more intermediary points between the joining points;

cleaning the gate recess using a chemical cleaning process; and forming a gate over the gate recess.

2. The method of claim 1, wherein each connecting section curves continuously around a respective source finger end or drain finger end.

3. The method of claim 1, wherein forming the III-N layer comprises forming a III-N channel layer and a III-N barrier layer, wherein a compositional difference between the III-N channel layer and the III-N barrier layer causes a 2DEG channel to be induced in the III-N channel layer adjacent to the III-N barrier layer.

4. The method of claim 3, comprising implanting ions into the III-N layer in one or more peripheral edge regions underneath the connecting sections of the gate recess, thereby causing the 2DEG channel not to be induced in the peripheral edge regions.

5. The method of claim 3, wherein etching the gate recess comprises etching the gate recess, in one or more peripheral edge regions underneath the connecting sections of the gate recess, to a depth sufficient to cause the 2DEG channel not to be induced under the gate in the peripheral edge regions.

6. The method of claim 1, wherein etching the gate recess comprises etching the gate recess to leave slanted sidewalls for the gate.

7. The method of claim 1, wherein forming the insulator layer comprises forming a gate insulator layer over the III-N layer, an etch stop layer over the gate insulator layer, and an electrode defining layer over the etch stop layer.

8. The method of claim 7, wherein etching the gate recess comprises etching the gate recess, in an active region underneath the straight sections, to a depth into the etch stop layer.

9. The method of claim 7, wherein the gate insulator layer comprises silicon nitride, the etch stop layer comprises aluminum nitride, and the electrode defining layer comprises silicon nitride.

10. The method of claim 1, wherein each connecting section is a curved section which curves around a respective source finger end or drain finger end.

11. A semiconductor device comprising:
a III-N layer;
a plurality of parallel conductive fingers on the III-N layer, including:
  a source bus and a drain bus;
  a plurality of source fingers coupled to the source bus and extending from the source bus towards the drain bus to respective source finger ends; and
  a plurality of drain fingers coupled to the drain bus and extending from the drain bus towards the source bus to respective drain finger ends, wherein the drain fingers are interdigitated between the source fingers;
an insulator layer over the III-N layer; and
a gate comprising:
  a plurality of straight sections, each straight section lying between a source finger and an adjacent drain finger and having a substantially uniform length along a direction of current flow of the semiconductor device; and
  a plurality of connecting sections, each connecting section joining two adjacent straight sections at joining points, each connecting section including a first edge proximal to a respective source finger end or drain finger end and a second edge opposite the first edge, wherein a length of the connecting section, measured in a direction substantially perpendicular to the first and second edges, gradually expands from a value of the substantially uniform length of the two adjacent straight sections at the joining points to a larger value at one or more intermediary points between the joining points.

12. The semiconductor device of claim 11, wherein each connecting section curves continuously around a respective source finger end or drain finger end.

13. The semiconductor device of claim 11, wherein the III-N layer comprises a III-N channel layer and a III-N barrier layer, wherein a compositional difference between the III-N channel layer and the III-N barrier layer causes a 2DEG channel to be induced in the III-N channel layer adjacent to the III-N barrier layer.

14. The semiconductor device of claim 13, wherein ions are implanted into one or more peripheral edge regions underneath the connecting sections of the gate, thereby causing the 2DEG channel not to be induced in the peripheral edge regions.

15. The semiconductor device of claim 13, wherein the gate is recessed, in one or more peripheral edge regions underneath the connecting sections of the gate, to a depth sufficient to cause the 2DEG channel not to be induced under the connecting sections of the gate in the peripheral edge regions.

16. The semiconductor device of claim 11, wherein the gate comprises slanted sidewalls.

17. The semiconductor device of claim 11, further comprising a recess in the insulator layer, wherein the gate is in the recess.

18. The semiconductor device of claim 17, wherein a length of a portion of the recess beneath the plurality of connecting sections is greater than a length of the recess in a direction of current flow beneath the plurality of straight sections.

19. The semiconductor device of claim 11, wherein the insulator layer comprises a gate insulator layer over the III-N layer, an etch stop layer over the gate insulator layer, and an electrode defining layer over the etch stop layer.

20. The semiconductor device of claim 19, wherein the gate is recessed, in an active region underneath the straight sections, to a depth into the etch stop layer.

21. The semiconductor device of claim 19, wherein the gate insulator layer comprises silicon nitride, the etch stop layer comprises aluminum nitride, and the electrode defining layer comprises silicon nitride.

22. The semiconductor device of claim 11, wherein each connecting section is a curved section which curves around a respective source finger end or drain finger end.

* * * * *